(12) United States Patent
Schmidt

(10) Patent No.: US 9,166,000 B2
(45) Date of Patent: Oct. 20, 2015

(54) POWER SEMICONDUCTOR DEVICE WITH AN EDGE TERMINATION REGION

(71) Applicant: Infineon Technologies Austria AG, Villach (AT)

(72) Inventor: Gerhard Schmidt, Wernberg (AT)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 14/248,423

(22) Filed: Apr. 9, 2014

(65) Prior Publication Data

US 2014/0217562 A1 Aug. 7, 2014

Related U.S. Application Data

(62) Division of application No. 13/152,373, filed on Jun. 3, 2011, now Pat. No. 8,759,935.

(51) Int. Cl.
| | |
|---|---|
| *H01L 31/102* | (2006.01) |
| *H01L 29/06* | (2006.01) |
| *H01L 29/167* | (2006.01) |
| *H01L 29/861* | (2006.01) |
| *H01L 21/265* | (2006.01) |

(52) U.S. Cl.
CPC ...... *H01L 29/0626* (2013.01); *H01L 21/26513* (2013.01); *H01L 29/0638* (2013.01); *H01L 29/0661* (2013.01); *H01L 29/167* (2013.01); *H01L 29/861* (2013.01); *H01L 29/8611* (2013.01)

(58) Field of Classification Search
CPC ............ H01L 29/872; H01L 29/66143; H01L 29/407; H01L 29/7811; H01L 29/402; H01L 29/7823; H01L 29/0615
See application file for complete search history.

(56) References Cited

U.S. PATENT DOCUMENTS

| | | | |
|---|---|---|---|
| 6,635,944 B2 | 10/2003 | Stoisiek | |
| 6,696,705 B1 | 2/2004 | Barthelmess et al. | |
| 8,361,893 B2 | 1/2013 | Schmidt et al. | |
| 2003/0183900 A1 | 10/2003 | Barthelmess et al. | |
| 2009/0008723 A1 | 1/2009 | Schmidt | |
| 2010/0078756 A1 | 4/2010 | Schmidt | |

FOREIGN PATENT DOCUMENTS

WO     0038242 A1     6/2000

*Primary Examiner* — David Vu
*Assistant Examiner* — Cuong Nguyen
(74) *Attorney, Agent, or Firm* — Murphy, Bilak & Homiller, PLLC

(57) ABSTRACT

A power semiconductor device includes a semiconductor substrate, an active device region disposed in the semiconductor substrate, an edge termination region spaced laterally outward from the active device region in the semiconductor substrate, and first and second trenches. The first trench is disposed in the edge termination region and has an inner sidewall, an outer sidewall and a bottom, the inner sidewall being spaced closer to the active device region than the outer sidewall. The second trench is spaced laterally outward from the first trench in the edge termination region, and extends further into the semiconductor substrate than the first trench and has a sidewall which outwardly faces the outer sidewall of the first trench and is doped opposite as the inner sidewall and bottom of the first trench.

5 Claims, 14 Drawing Sheets

POWER SEMICONDUCTOR DEVICE WITH AN EDGE TERMINATION REGION

This application is a divisional of U.S. patent application Ser. No. 13/152,373 filed 3 Jun. 2011, the content of said application incorporated herein by reference in its entirety.

FIELD OF TECHNOLOGY

The present application relates to power semiconductor devices, in particular power semiconductor devices with a high blocking voltage capacity.

BACKGROUND

Many power semiconductor devices are fabricated on the same semiconductor substrate. The devices are physically separated following processing via a so-called dicing process which can be accomplished by scribing and breaking the substrate, by mechanically sawing (e.g. with a dicing saw) or by laser cutting. In each case, the lateral edge of each device has crystal defects which result from the dicing process. Leakage current significantly increases due to the crystal defects if any equipotential lines are permitted to reach the lateral edge of the device, reducing the blocking voltage capacity of the device.

To ensure a sufficiently high blocking voltage capacity for high-voltage semiconductor devices fabricated from e.g. Si or SiC, suitable measures must be implemented in the edge termination region at the lateral edge of the device. For modern MOS (metal oxide semiconductor) controlled power switches such as SIPMOS transistors, IGBTs (insulated gate bipolar transistors) or DMOS (double-diffused metal-oxide-semiconductor) transistors as well as high-voltage diodes, the strength of the electric field must be fully dissipated between the active device region and the saw edge of the device. Otherwise, field magnification occurs at the edge of the device.

The higher the reverse capacity of the device, the more complicated are generally also the requirement on the passivation layers. For IGBT products, as well as the associated freewheeling diodes, reverse voltages of 600 V to up to 6.5 kV are currently required. The edge termination region is in this case frequently realized with a planar design. The purpose of the edge construction is to ensure that the equipotential lines are conducted from the inner part of the device to the surface in such a way that their curve and thickness do not lead to any premature onset of avalanche generation in the silicon, or to a dielectric breakdown in the passivation layers, and that the blocking capacity of the device will be lowered far below the value of the volume breakdown voltage.

Other critical locations are the steps and edges in the topology of the edge construction. Peak field strengths of several MV/cm can build up on the surface in these locations during dynamic operation, creating extremely high requirement for the robustness of the protective passivation layers on the surfaces. When these requirements are not fully met, there the device can fail after a certain number of switching cycles.

Several conventional techniques can be applied in order to ensure a sufficiently high blocking voltage capacity in the edge termination. Each of these techniques attempts to weaken the electric field on the surface and to increase the tolerance region relative to the surface charges. The intent is to create potential relationships on the surface of the semiconductor material which can be maintained in a stable manner over a long period of time. For mesa termination structures, the contouring of the edge of the semiconductor is performed in the form of inclined cross-sections or trenches created with the blocking pn-transitions. For planar termination structures, the dissipation of the field strength must be brought about with suitable masking techniques. Accordingly, either a lateral development of doping is provided with the doping concentration adjusted accordingly, or so-called field plate constructions are used, through which the strength of the surface field can be laterally dissipated in a suitable manner in the insulation layer surface which is located between the field plate constructions and the surface of the semiconductor.

However, a considerable portion of the surface of the device is required for the optimization of a highly blocking planar edge with respect to the blocking potential and blocking stability. Typically, a twofold or threefold base thickness is set for the width of the edge termination. The high area requirement arises because the curving of the equipotential lines occurs for the most part in the silicon so that they can be led out to the surface. The curving of the equipotential lines is connected with an increase of the electric field. If the field exceeds a critical value, an avalanche breakdown occurs. In order to keep the curve radius sufficiently low, a field plate construction with a cushion oxide for a 600 V device requires an edge termination width of approximately 200 to 250 µm. An edge width of more than 2,000 µm is required with such a structure already for a blocking capacity of 6.5 kV.

Also, a planar high-voltage termination edge increases the expense associated with optimizing the simulation and increases the process complexity during the manufacturing. An overly complex process is particularly expensive for high-voltage diodes because the basic structure in the active part of the device is relatively simple and only requires a few process steps.

In contrasts to planar edge termination structures, mesa edge termination structures shift (at least partially) the dissipation of the field strength in the vertical depth of the device and the edge requirement is thus correspondingly smaller. Such a mesa edge termination is widely used for the manufacturing of high-voltage devices in the long-established bipolar technology, such as for example for thyristors.

However, very rough, mechanical techniques such as grinding, lapping or sandblasting are employed, which cannot be integrated with the manufacturing of MOS devices for reasons related to defect density. Moreover, the devices must be isolated for mechanic edge processing (for example with laser cutting operations), and then further processed and finished as individual chips or dies. This is also not compatible with the manufacturing of wafers which have standard diameters at a high level of automation.

Alternative technologies which are compatible with MOS technology are now available with the development of modern trench cell concepts, for example with new IGBT generations, which are suitable for the manufacturing of a vertical edge termination. With the vertical design of the edge termination structure, a circumferential trench is formed at the device edge, approximately in the area of the kerf along the dies which are later separated, through the depth of the drift zone. The blocking voltage capacity is improved with the integration of the acceptors (p-type dopants) in the sidewall of the vertical trench. For alternative, the trench can be set off from the lateral edge of the device so that the terminating edge region serves as a lateral field plate which is connected to the rear side potential. The equipotential lines can thus be led to the upper part in the trench which is filled with a dielectric material, and the actual chip edge remains field-free.

With the implantation of a higher acceptor dose in the bottom of the trench as opposed to the sidewall, the depth of the trench can be reduced with a structure having a side field plate by about a half. The structure is thus suitable for process integration with thin wafer technology in which a highly doped carrier material is no longer used.

However, the reduction of trench depth together with an increasing so-called punch through (PT) dimensioning leads to a behaviour in which the equipotential lines running through the structure under the bottom of the trench are "curved back" with a relatively large curve radius in the outermost region to a channel stopper region. This requires a considerable amount of space for the width of the lateral field stop zone in order to prevent impacting of the space charge zone (SCZ) at the lateral saw edge, which leads to a massive leakage current increase due to the damage caused to the crystals. The width of the lateral field stop zone can correspond to twice the width of the edge trench depending on the strength of the PT dimensioning. This indeed holds strongly true without limitations only in the fast switching case, since under the conditions of a static blocking load, accumulation of holes occurs at the outer lateral trench edge due to thermal generation, which partially shield the field against lateral spread. However, numeric simulations provide evidence that the shielding effect practically disappears with a relatively small depth of the trench, such as for example a half of the thickness of the chip, and with increased PT dimensioning, and that hardly any effect is exerted on the distribution of the equipotential lines even in the static blocking mode.

SUMMARY

In order to minimize the edge requirement in view of punch-through dimensioning, lateral field dissipation is provided by a zone of donors reaching into the vertical depth of semiconductor substrate. The donors preferably have a lateral dose above the breakdown charge of the substrate.

In one embodiment, the zone can be located either at the outermost sidewall of a vertical trench formed in an edge termination region of the semiconductor substrate, or at a distance from the trench between the lateral edge and the trench. This embodiment provides a space saving trench edge termination which may include a lateral channel stop zone. The lateral channel stop zone reaches into the vertical depth of the semiconductor substrate and thus reduces the area needed curving back the retrograde equipotential lines in the outer edge region with a reduced trench depth and with distinct punch through dimensioning. Punching of the space charge zone can be prevented at the outer edge of the device despite having a reduced width of the lateral field stop zone.

In another embodiment, the lateral field dissipation is provided by a deep in-diffusion of donors in a lateral field stop zone. This provides local reinforcement for the basic doping, which leads to pushing back of equipotential lines. Phosphorus enhanced diffusion of chalcenogides is particularly suitable for this purpose, the chalcenogides acting as double donors when built into lattice locations. For example, the inward diffusion of selenium can be accelerated under the influence of an edge layer which is highly doped with phosphorus, so that penetration depths on the order of magnitude of 100 μm or deeper can be realized with a relatively low thermal budget.

According to an embodiment of a power semiconductor device, the device includes a semiconductor substrate, an active device region disposed in the semiconductor substrate, an edge termination region disposed in the semiconductor substrate between the active device region and a lateral edge of the semiconductor substrate, and a trench disposed in the edge termination region which extends from a first surface of the semiconductor substrate toward a second opposing surface of the semiconductor substrate. The trench has an inner sidewall, an outer sidewall and a bottom. The inner sidewall is spaced further from the lateral edge of the semiconductor substrate than the outer sidewall, and an upper portion of the outer sidewall is doped opposite as the inner sidewall and bottom of the trench.

According to an embodiment of a method of manufacturing a power semiconductor device, the method includes forming an active device region in a semiconductor substrate and an edge termination region between the active device region and a lateral edge of the semiconductor substrate and forming a trench in the edge termination region which extends from a first surface of the semiconductor substrate toward a second opposing surface of the semiconductor substrate. The trench has an inner sidewall, an outer sidewall and a bottom. The inner sidewall is spaced further from the lateral edge of the semiconductor substrate than the outer sidewall. The method further includes doping an upper portion of the outer sidewall opposite as the inner sidewall and bottom of the trench.

According to another embodiment of a power semiconductor device, the device includes a semiconductor substrate, an active device region disposed in the semiconductor substrate, an edge termination region spaced laterally outward from the active device region in the semiconductor substrate and a first trench disposed in the edge termination region. The first trench has an inner sidewall, an outer sidewall and a bottom, the inner sidewall spaced closer to the active device region than the outer sidewall. The power semiconductor device further includes a second trench spaced laterally outward from the first trench in the edge termination region. The second trench extends further into the semiconductor substrate than the first trench and has a sidewall which outwardly faces the outer sidewall of the first trench and is doped opposite as the inner sidewall and bottom of the first trench.

According to an embodiment of a method of manufacturing a power semiconductor device, the method includes forming an active device region in a semiconductor substrate and an edge termination region spaced laterally outward from the active device region, forming a first trench in the edge termination region which has an inner sidewall, an outer sidewall and a bottom, the inner sidewall spaced closer to the active device region than the outer sidewall, and forming a second trench spaced laterally outward from the first trench in the edge termination region. The second trench extends further into the semiconductor substrate than the first trench and has a sidewall which outwardly faces the outer sidewall of the first trench. The method further includes doping the sidewall of the second trench opposite as the inner sidewall and bottom of the first trench.

According to yet another embodiment of a power semiconductor device, the device includes a semiconductor substrate, an active device region disposed in the semiconductor substrate, an edge termination region disposed in the semiconductor substrate between the active device region and a lateral edge of the semiconductor substrate, and a region of chalcogen dopant atoms disposed in the edge termination region adjacent the lateral edge of the semiconductor substrate.

According to an yet embodiment of a method of manufacturing a power semiconductor device, the method includes forming an active device region in a semiconductor substrate, forming an edge termination region between the active device region and a lateral edge of the semiconductor substrate, and forming a region of chalcogen dopant atoms in the edge termination region adjacent the lateral edge of the semiconductor substrate.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
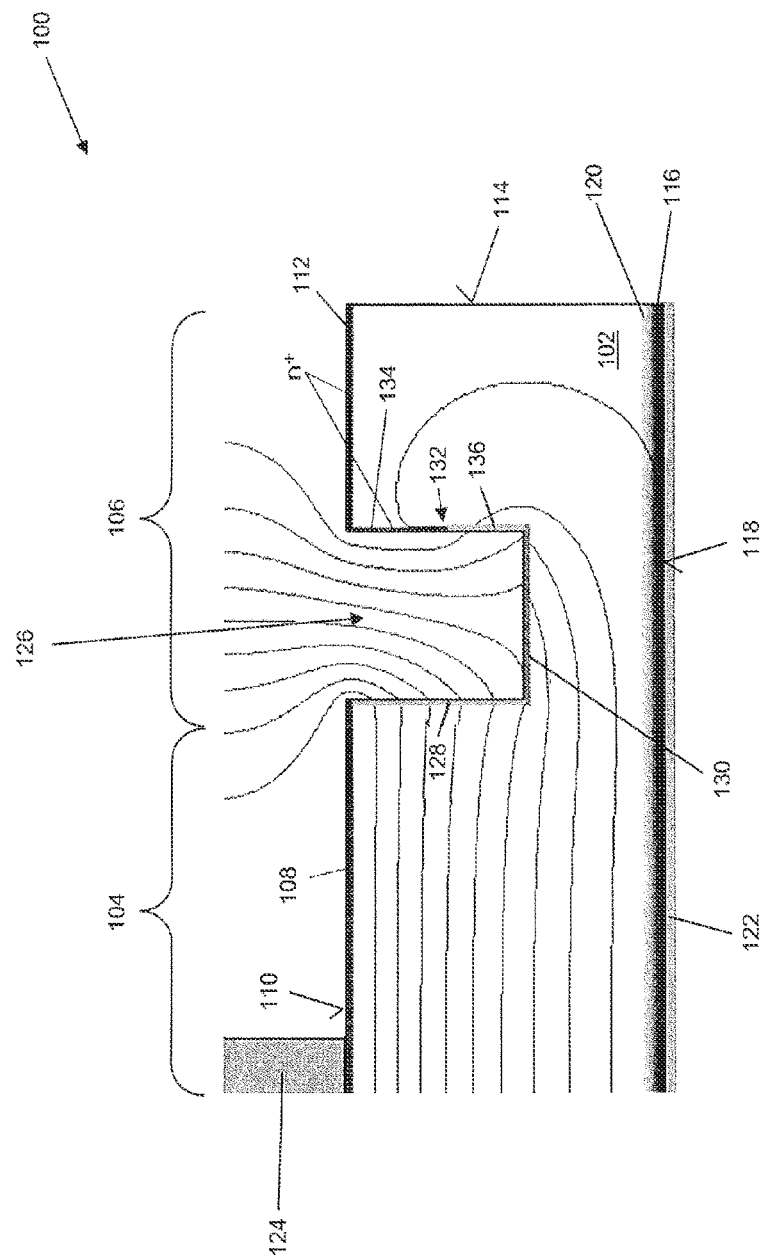
FIG. 1 illustrates a partial cross-sectional schematic view of a power semiconductor device according to an embodiment.

A number of embodiments are explained next. Identical structural features are identified by identical or similar reference symbols in the Figures. In the context of the present description, "lateral" or "lateral direction" should be understood to mean a direction or extent that runs generally parallel to the lateral extent of a semiconductor material or semiconductor body. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

Power semiconductor devices are described below. The power semiconductor devices may be of different types, may be manufactured by different technologies and may include, for example, integrated electrical, electro-optical or electro-mechanical circuits or passives. The power semiconductor devices may include inorganic and/or organic materials that are not semiconductors, such as, for example, discrete passives, antennas, insulators, plastics or metals. Furthermore, the devices described below may include further integrated circuits to control the power integrated circuits of the power semiconductor chips.

The power semiconductor devices may include power MOSFETs (Metal Oxide Semiconductor Field Effect Transistors), DMOSFETs (Double-diffused MOSFET), IGBTs (Insulated Gate Bipolar Transistors), JFETs (Junction Gate Field Effect Transistors), power bipolar transistors or power diodes such as power Schottky diodes. Some power semiconductor devices have a vertical structure in that the devices are fabricated in such a way that electric currents can flow in a direction perpendicular to the main faces of these power semiconductor devices.

A power semiconductor device having a vertical structure, i.e. vertical power semiconductor device, may have terminals such as contacts on its two main faces, that is to say on its top side and bottom side, or, in other words, on its front side and rear side. By way of example, the source electrode and the gate electrode of a power MOSFET may be situated on one main face, while the drain electrode of the power MOSFET may be arranged on the other main face. The contacts may be made of aluminum, copper or any other suitable material. One or more metal layers may be applied to the contact pads of the power semiconductor chips. The metal layers may, for example, be made of titanium, nickel vanadium, gold, silver, copper, palladium, platinum, nickel, chromium or any other suitable material. The metal layers need not be homogenous or manufactured from just one material, that is to say various compositions and concentrations of the materials contained in the metal layers are possible. Conversely, electric currents flow in a direction parallel to the main faces of lateral power semiconductor devices.

Various embodiments are described next with emphasis on the edge termination structure of power semiconductor devices. The edge termination structures described herein can be included in any type of power semiconductor device to increase the blocking voltage capacity of the device. For ease of illustration only, the embodiments illustrate the power semiconductor devices as power diodes. However, any type of power semiconductor device can include the edge termination structures described herein.

FIG. 1 illustrates an embodiment of a power diode 100 designed for operation at e.g. 1,200 V. The diode 100 includes a semiconductor substrate 102 such as an n-doped silicon wafer which may or may not have an epitaxial layer. In one embodiment, the semiconductor substrate 102 has a specific resistance of about 53 Ωcm and a thickness of about 125 μm. The diode 100 has an inner active device region 104 and an outer edge termination region 106. A p$^+$ doped anode region 108 having a surface concentration e.g. of about $1 \cdot 10^{17}$ cm$^{-3}$ and a junction depth of about 6 μm is formed at the top surface 110 of the semiconductor substrate 102 in the active device region 104. An optional n$^+$ doped channel stop region 112 is formed in the edge termination region 106 toward the lateral edge 114 of the diode 100 i.e. the side of the diode 100 which is cut to separate the diode 100 from other devices manufactured on the same substrate. Alternatively, the channel stop region 112 can be p$^+$ doped. An n$^+$ emitter 116 is located at the rear side 118 of the diode 100 and has a surface concentration e.g. of about $3.5 \cdot 10^{15}$ cm$^{-3}$ and a penetration depth of about 2 μm. A pre-charged field stop zone 120 with a maximum concentration of e.g. $1.3 \cdot 10^{14}$ cm$^{-3}$ and a penetration depth of 10 μm is also located at the rear side 118. A cathode electrode 122 electrically contacts the emitter 116 at the rear side 118 and an anode contact 124 electrically contacts the anode 108 at the top side 110. A portion (inner) of the active device region 104 is out-of-view in FIG. 1.

The blocking voltage is absorbed at the lateral edge 114 of the diode 100 by a circumferential trench 126 having e.g. a width of 60 µm and a depth of 70 µm. The inner sidewall 128 of the trench 126 (i.e. the sidewall spaced furthest from the lateral edge of the diode) and the bottom 130 of the trench 126 are implanted with p-type dopants such as boron. In one embodiment, the inner trench sidewall 128 has p$^-$ doping to reduce the critical electrical field strength of the p$^+$ to n$^-$ junction between the anode region 108 and the substrate 102, and to prevent a breakdown in the surface. The bottom 130 of the trench 126 has (higher) p doping to compensate for donor charges in the depth and thus allowing a reduction of the depth of the trench 126 to about a half of the substrate thickness, without causing a breakdown in the region of the bottom 130 of the trench 126. The channel stop region 112 extends between the outer sidewall 132 of the trench 126 (i.e. the sidewall spaced closest to the lateral edge of the diode) and the lateral edge 114 of the diode 100. In some embodiments, the channel stop region 112 has a surface concentration of about $1 \cdot 10^{18}$ cm$^{-3}$ and a penetration depth of about 6 µm. The trench 126 can be filled with a material having a dielectric constant of e.g. $\epsilon=3.9$. With optimized doping ratios, the breakdown in the volume of the device occurs with a blocking voltage of 1,830 V. The resulting distribution of equipotential lines is shown in FIG. 1.

The upper portion 134 of the outer trench sidewall 132 is doped n-type instead of p-type e.g. with n$^+$ doping. The n-type dose of the upper portion 134 of the outer trench sidewall 132 can be adjusted similarly to the level in the channel stop region 112, and thus is above the breakdown charge of the semiconductor substrate 102. Avalanche breakdown can take place in the outer corner of the trench bottom 130, thus indicating a certain loss of blocking voltage is inevitable between the p doping in the trench bottom 130 and the vertical channel stop region within the trench 134. For this reason, the n$^+$ doping can be restricted to the upper portion 134 of the outer trench sidewall 132. In one embodiment, the n+ doping of the outer trench sidewall 132 extends a length of 30 µm from the top surface 110 of the semiconductor substrate 102 to achieve full volume blocking capability. The lower portion 136 of the outer trench sidewall 132 can have p– doping in this case. Of course, the doping types described above could be reversed for a p-channel device.

Figure 2:
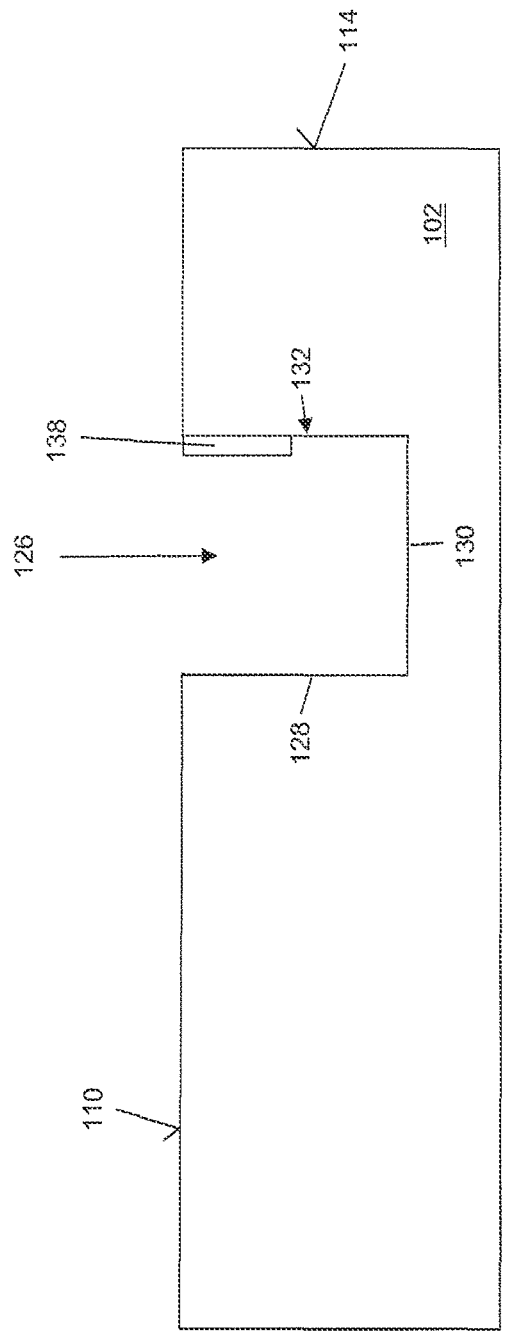
FIGS. 2-3 illustrate an embodiment of a method of doping the sidewalls and bottom of a trench formed in the edge termination region of a power semiconductor device.
Figure 3:
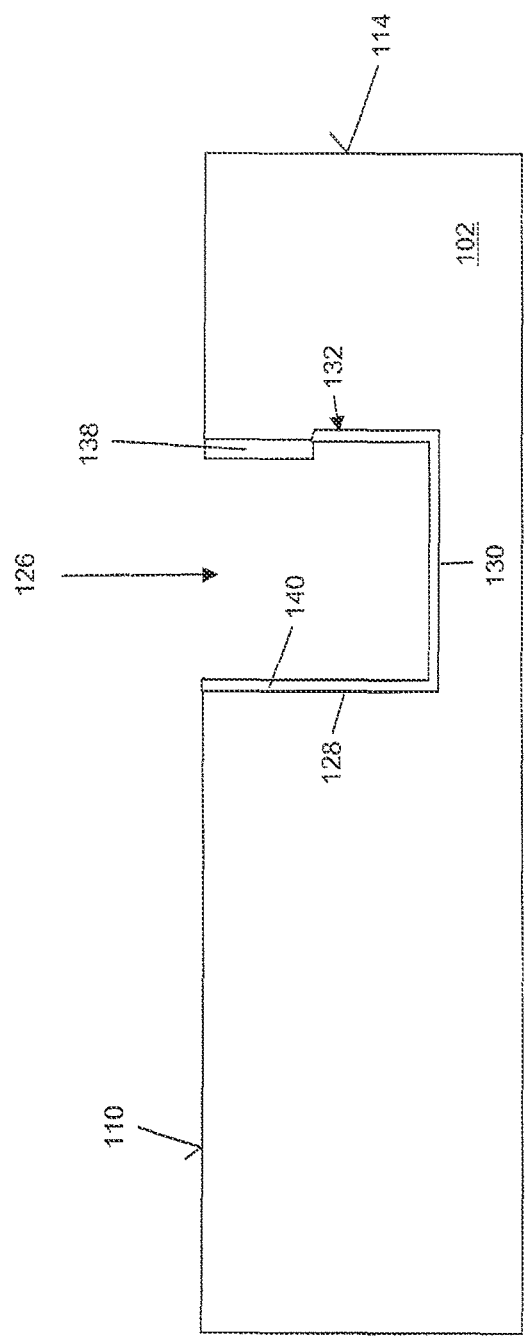

FIGS. 2 and 3 illustrate an embodiment of forming the vertical trench 126 with the different doping types described above. FIG. 2 shows the trench 126 etched in the semiconductor substrate 102. In some embodiments, the semiconductor substrate 102 is less than 200 µm thick and the trench 126 extends from the top surface 110 of the substrate 102 to a depth of ⅔ or less of the thickness of the substrate 102. FIG. 2 also shows a mask layer 138 deposited on the upper portion of the outer trench sidewall 132 for shielding this portion of the outer sidewall 132 from p-type dopants. FIG. 3 shows the semiconductor substrate 102 after the inner sidewall 128, bottom 130 and lower portion of the outer sidewall 132 are doped p-type e.g. via an implantation or diffusion process, yielding a p-type implantation region 140 in these regions of the trench 126. The mask 138 is then removed from the upper part of the outer sidewall 132. The inner sidewall 128, bottom 130 and lower portion 136 of the outer sidewall 132 of the trench 126 are then covered by a mask and the upper portion 134 of the outer trench sidewall 132 is doped n-type e.g. via an implantation or diffusion process, yielding the structure shown in FIG. 1.

Figure 4:
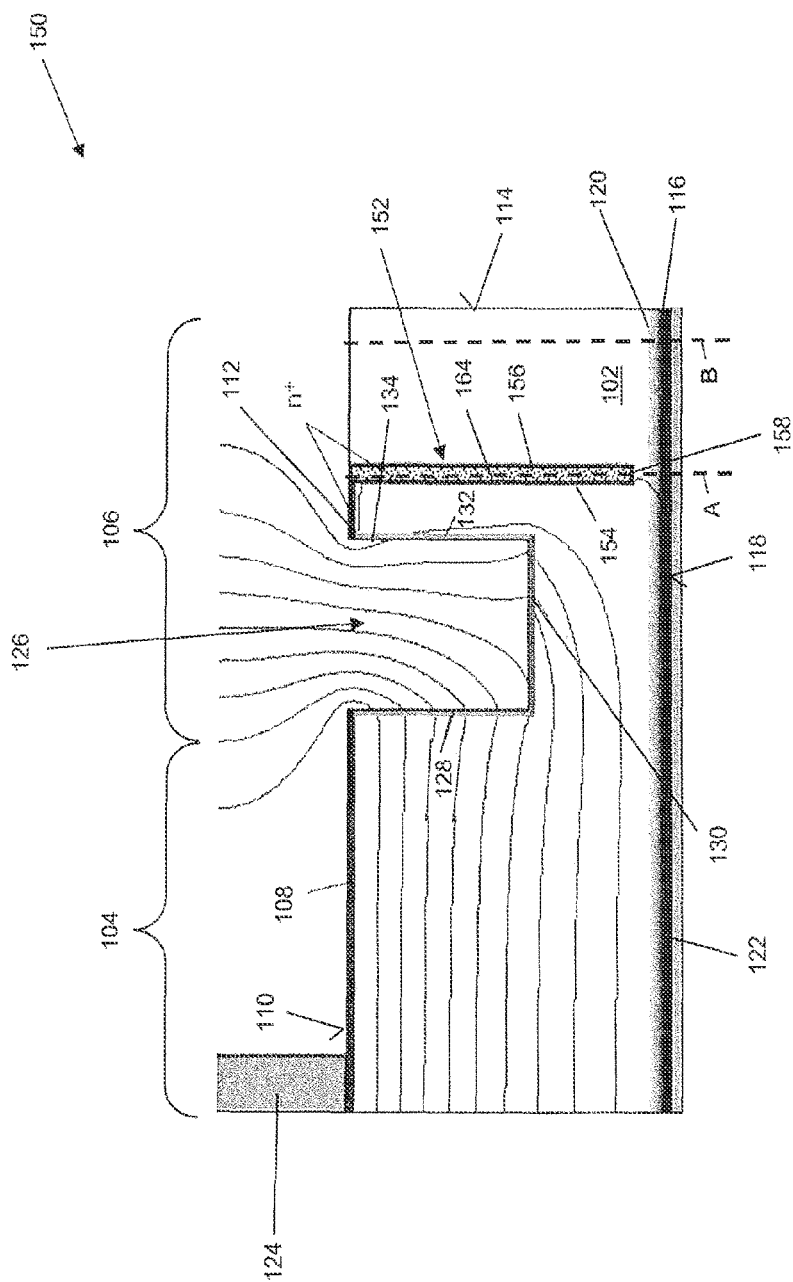
FIG. 4 illustrates a partial cross-sectional schematic view of a power semiconductor device according to an embodiment.

FIG. 4 illustrates another embodiment of a power diode 150 where a deeper, second trench 152 is spaced laterally outward from the first trench 126 in the edge termination region 106. The second trench 152 extends further into the semiconductor substrate 102 than the first trench 126 and has an inner sidewall 154 which outwardly faces the outer sidewall 132 of the first trench 126 and is doped opposite as the inner sidewall 128 and bottom 130 of the first trench 126. In one embodiment, the sidewalls 154, 156 of the second trench 152 have n$^+$ doping and the second trench 152 is laterally spaced apart from the first trench 126 by about 20 µm. The bottom 158 of the second trench 152 ends in one embodiment at about 15 µm above the rear surface 118 of the semiconductor substrate 102. The second trench 152 with n-type doping prevents the retrograde development of outer potential lines so that the space between the second trench 152 and the lateral edge 114 of the substrate remains relatively field free. The width of the edge termination region 106 (i.e. the lateral distance between the outer sidewall of the first trench and the lateral side of the substrate) can be reduced to about 80 µm in some embodiments.

Figure 5:
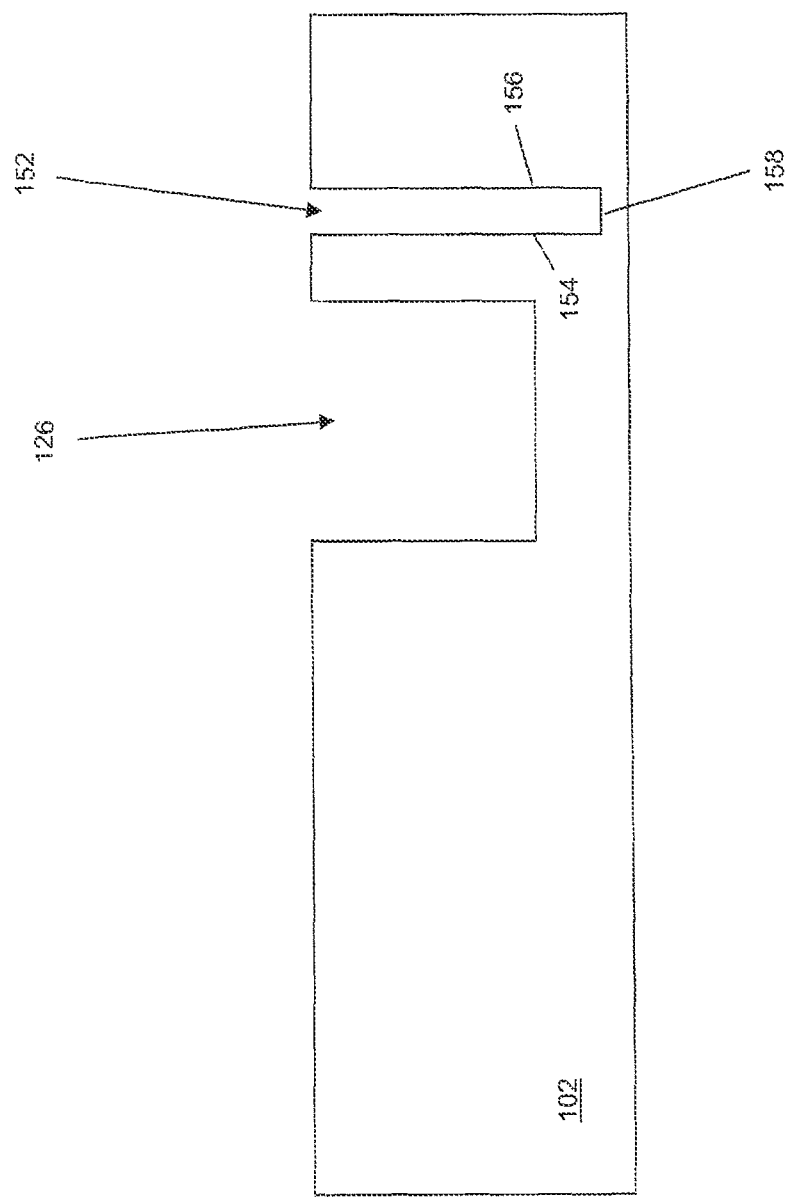
FIGS. 5-6 illustrate an embodiment of a method of forming two trenches in the edge termination region of a power semiconductor device.
Figure 6:
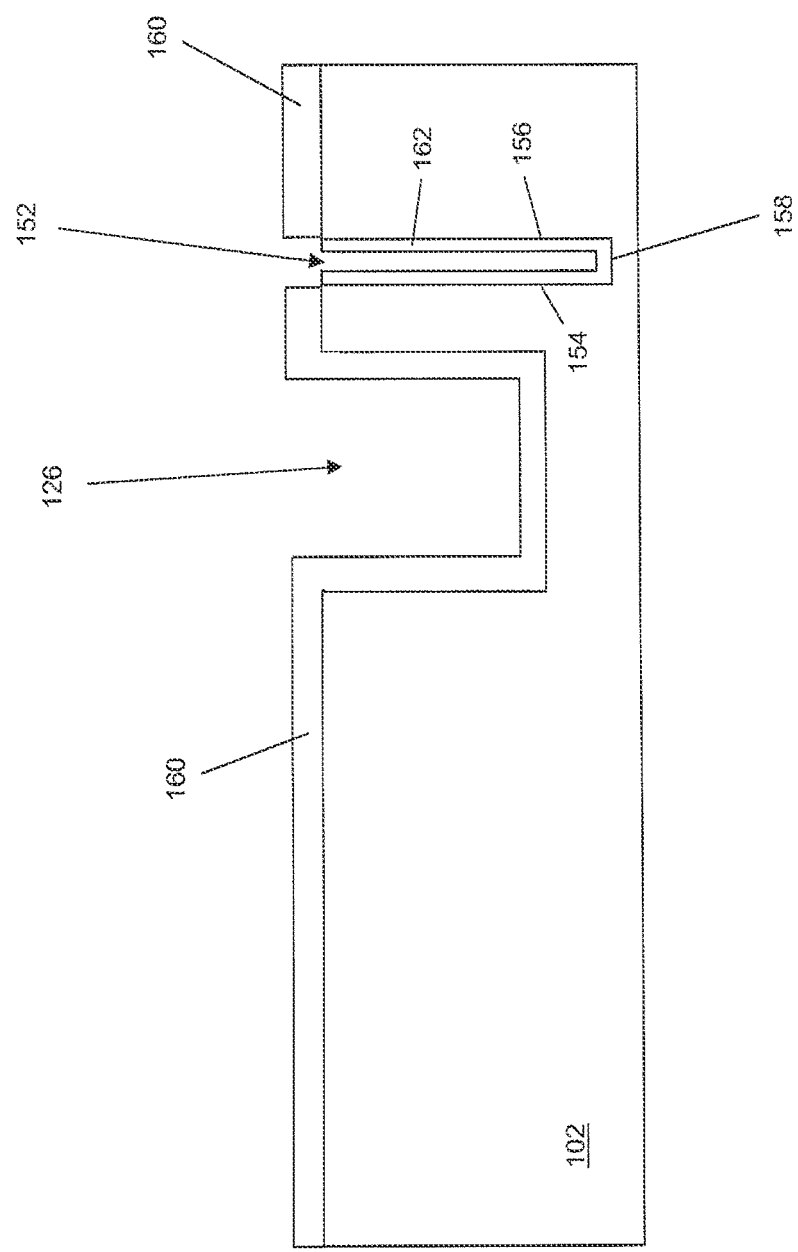

FIGS. 5 and 6 illustrate an embodiment of forming the first and second trenches 126, 152 in the semiconductor substrate 102. FIG. 5 shows the first trench 126 etched in an inner part of the edge termination region and the second trench 152 etched in the substrate 102 between the first trench 126 and the lateral edge 114 of the power diode 150. FIG. 6 shows a hard mask 160 such as a USG (undoped silicon glass) hard mask deposited over the semiconductor substrate 102 except in the region of the second (outer) trench 152 and phosphorus glass (PSG) 162 is deposited in the second trench 152. A diffusion step is then performed to diffuse phosphorus from the PSG into the sidewalls 154, 156 and bottom 158 of the second trench 152. Alternatively, phosphorus can be implanted into the sidewalls 154, 156 and bottom 158 of the second trench 152. The PSG 162 is removed in the first embodiment and the second trench 152 filled with polysilicon 164 as shown in FIG. 4.

The outer field stop trench 152 can be made before the inner trench 126, because the refill with polysilicon 164 is difficult to mask above the inner trench 126 due to the high temperature. After removal of the polysilicon from the top surface 110 of the semiconductor substrate 102 e.g. via CMP (chemical mechanical polishing), the process sequence for the inner trench 126 can be performed more easily. In either case, a CMP step is carried out in order to remove the polysilicon from the top surface 110 of the semiconductor substrate 102. The anode 108 and optional channel stop region 112 are then implanted and driven in. If provided, the channel stop region 112 is formed in the top surface 110 of the semiconductor substrate 102 between the outer sidewall 132 of the first trench 126 and the inner sidewall 154 of the second trench 152. The channel stop region 112 can be omitted, since extending of the space charge zone into the device edge 114 is already reliably prevented by the n+ doped second trench 152. Optionally a process for reduction of minority carrier lifetime like Pt diffusion or high energy electron irradiation can be subsequently carried out in order to adjust the dynamic behavior of the diode 150.

FIG. 4 shows the resulting structure. The second trench 152 can then be etched, e.g. via a USG hard mask. Further processing can also be performed such as removing damage e.g. by annealing, implanting boron in the sidewalls 128, 132 and bottom 130 of the first trench 126, followed by further penetration, filling the first trench 126, planarization, metallization and passivation. The rear side 118 of the substrate 102 can then be processed to produce the cathode 116, field stop zone 120, and metallization 122.

The power diode 150 can be physically separated from other devices fabricated on the same semiconductor substrate by cutting through the edge termination region 106. In one embodiment, the second trench 152 is arranged in the kerf as indicated by the dashed line labelled 'A' in FIG. 4, so that the cutting tool cuts through the second trench 152. That is, the field limiting second trench 152 is located directly in the scribe line so that a saw trace runs the second trench 152. At least the inner highly doped sidewall 154 of the second trench 152 remains a part of the power diode 150 after cutting. The second trench 152 is an open trench according to this embodiment in that the remaining semiconductor substrate (post cutting) does not laterally contain the second trench 152 in a region opposing the inner sidewall 154 of the second trench 152. As such, either the trench fill material 164 or the inner sidewall 154 of the second trench 152 is exposed after cutting. In this case the left and right edges of the separated semiconductor substrate can be, respectively, associated with neighbouring chips. Alternatively, the cutting occurs outside the second trench 152 as indicated by the dashed line labelled 'B' in FIG. 4. The second trench 152 is a closed trench according to this embodiment in that the second trench 152 is laterally contained on all sides by the remaining semiconductor substrate. In each case, the processes described above can be applied to other semiconductor materials which can be e.g. SiC, GaN, GaAs, etc.

In other embodiments, the basic doping of the semiconductor substrate can be reinforced at the chip edge and into the drift zone with a diffused region of chalcogen dopant atoms such as selenium which curve the equipotential lines away from the lateral edge of the substrate and toward the top surface to increase the blocking voltage capacity for a device with a shrinked lateral channel stop region. Chalcogens tend to create cluster formations in a semiconductor lattice such as a Si lattice. Chalcogen pairs form complexes of a higher order close to the implanted surface with its own kind of donor levels, as opposed to being isolated to an atom which is positioned at one place in the lattice. Chalcogens are stored preferably on crystal defects close to the wafer surface where they are electrically active only to a very small extent. Accordingly, the depth of the defect at the side of the crystal, as well as disturbances of the lattice which can be caused by the actual ion implantation can have a decisive influence on the subsequent diffusion behavior (diffusion to the side or diffusion to the lattice defects produced in this manner). For example, the use of selenium as a doping substance results in a small percentage of the implanted dose of the substance being in-diffused electrically activated under typical curing conditions of e.g. 900 to 1000° C.

The diffusion mechanism of selenium is enhanced in the presence of self-interstitial atoms e.g. of silicon self interstitials in the case of a silicon wafer. Selenium atoms located in fixed lattice positions are evicted by the self-interstitials into an intermediate lattice where they become mobile. The more the lattice is oversaturated with self-interstitial atoms, the greater the diffusion constant of the selenium atoms due to the increased mobility. To achieve the highest diffusion depths possible with a limited thermal budget, point defects (interstitials) that are created with implantation of ions should be created with a suitable temperature and with a time profile which has the highest possible efficiency (IED=implantation enhanced diffusion), along with diffusion in an oxidizing atmosphere e.g. during a thermal oxidation or a pyrolytic TEOS decomposition of $SiO_2$. The lattice is thus oversaturated with Si self-interstitial lattice atoms. These self-interstitial lattice atoms enhance the diffusion characteristics of implanted chalcogen atoms.

Chalcogens act as double donors and have a high diffusion constant as compared to pentavalent elements such as P, As or Sb, so that higher penetration depths can be realized during the same processing temperatures such as between 900° C. and 1,000° C. For example, Se implantation and diffusion can be used with IGBTs, JFETs, power MOSFETs and diodes, in addition to or as an alternative to proton irradiation, to form an area with increased n-doping in the edge termination region which curves the equipotential lines away from the lateral edge of the semiconductor substrate.

Selenium diffuses interstitially, where the inward diffusion is accelerated when the semiconductor crystal is oversaturated with self interstitial lattice atoms (self interstitials) as selenium atoms located in lattice positions are evicted by the self interstitials into the intermediate lattice where they are mobile. The stronger the oversaturation of the lattice with e.g. interstitial Si atoms, the higher the diffusion coefficient. In addition, because of the supply of self interstitials, which are present for example with thermal oxidation or with diffusion of phosphorus including a high surface concentration, the diffusion depth of Se or other chalcogens such as S or Te can be further increased with a comparable thermal budget.

A strong segregation/outdiffusion of selenium (or other chalcogen) takes place at the same time, either in the oxide which is grown in this manner or in the surface regions of a phosphorus-containing layer. The maximum concentration of selenium is in this case strongly decreased during the inward diffusion, so that with higher diffusion depths it is no longer guaranteed for a dose that is required for an effective field stop. However, an increase of the implantation dose which is used to compensate for these losses is successful to a limited extent because as the dose is increased, the Si lattice is increasingly amorphized on the side with the ion implantation and the tendency of selenium or other chalcogen to form inactive clusters in the damaged crystal region supports and further intensifies the loss on the electric active centers under these circumstances.

Selenium has four discrete energy levels which are associated with the simple and double interference positions of a substitution integrated Se atom or a Se pair. After annealing, the pair centers disappear in the DLTS (deep level transient spectroscopy) spectrum almost completely at a temperature above 900° C., so that the energy level associated with the individual Se interference position at 250 meV (for the single charge center) and at 496 meV (for the double charge center) prevail under the conduction band in the spectrum. An oppositely oriented mechanism of segregation is created in particular when a phosphorus-driven inward diffusion is employed in the highly doped phosphorus surface layer for formation of an arch-shaped diffusion profile with a wide maximum in the vertical depth. This effect can be utilized to adjust an inward diffusion reaching as deep as possible. In one embodiment, the indiffusion of phosphorus is conducted with a gas phase e.g. from a $POCL_3$ or $PH_3$ doping source, or from another gas combination containing phosphorus. Doing so produces a very high surface concentration of phosphorus and the lattice can thus be effectively oversaturated with self interstitials. In another embodiment, P-implantation can be carried out to release the self interstitials.

The region of chalcogen atoms can be driven in by the injection of self-interstitials from an optional channel stopper zone. A trench formed in the edge termination region causes most equipotential lines to curve away from the lateral edge of the substrate toward the top surface. Due to the higher n-doping, the outermost potential lines in the retrograde direction are pushed back in the outer chip region and the space requirements for the SCZ are minimized with a reduced trench depth and distinct punch through dimensioning in the lateral field stop zone. The edge termination area can be thus shrunk further, without causing lateral punching of the outermost potential line through the cut edge of the substrate.

If the optional channel stopper is provided in the edge termination region, which usually but not necessarily includes a highly doped phosphorus end zone, it is possible to use inward diffusion of selenium (or other chalcogen) in a subsequent high temperature step. The phosphorus edge layer can be in this case generated with a selective deposition of $PH_3$ or $POCl_3$ (through an oxide mask), or with masked ion implantation (for example through a resist mask).

Figure 7:
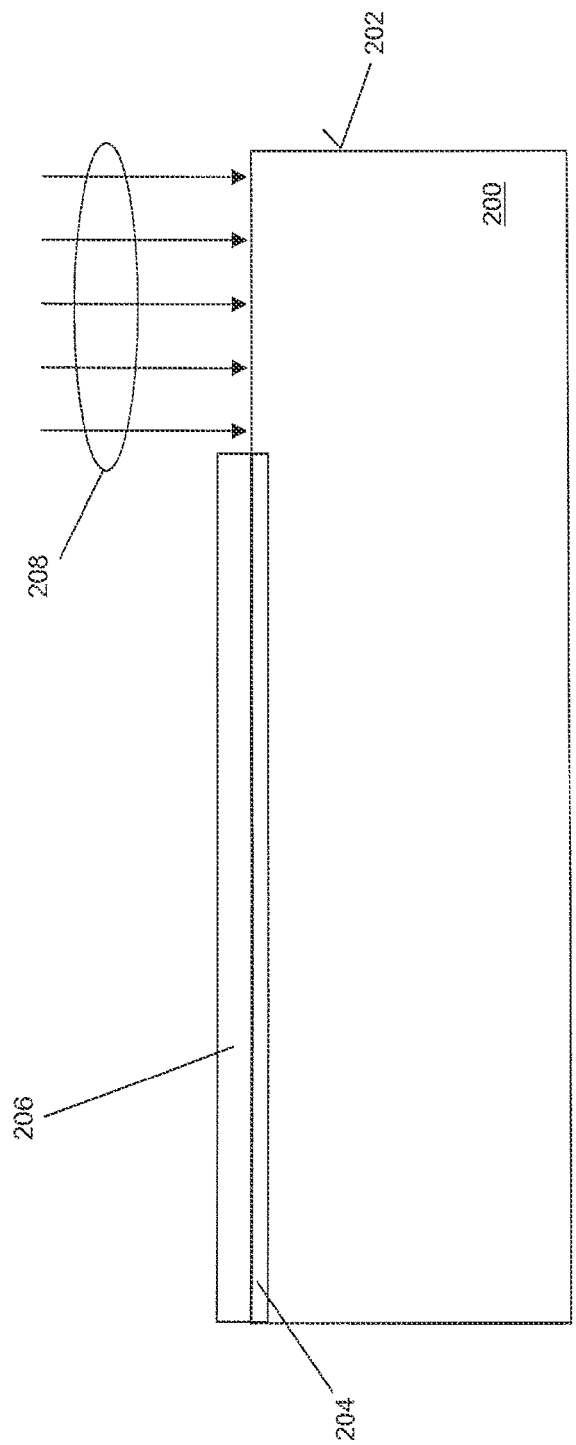
FIGS. 7-8 illustrate an embodiment of a method of forming a region of chalcogen dopant atoms in the edge termination region of a power semiconductor device.
Figure 8:
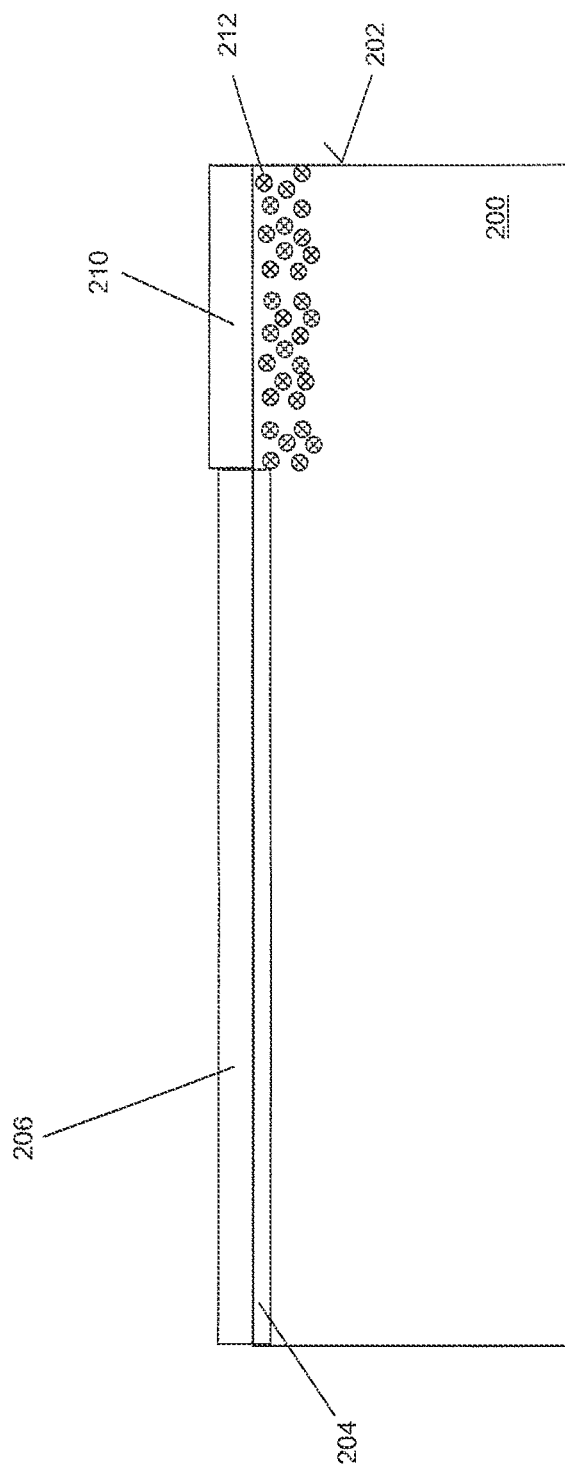

FIGS. 7 and 8 illustrate an embodiment of forming a region of chalcogen dopant atoms in the edge termination region of a power semiconductor device adjacent the lateral edge 202 of a semiconductor substrate 200. After the implantation of an anode region 204 through a resist mask using for example boron, either the growth of a thermal oxide 206 is provided, or a CVD deposition of an oxide layer for example a TEOS mask is separated out. In this case, etching can be applied with photo technology to the regions which are used for the optional channel stop region, which is followed by Se (or other chalcogen) implantation 208 as shown in FIG. 7. A phosphorus region is then provided. For example, $PH_3$ or $POCl_3$ can be deposited through the mask to form a phosphorus-containing layer 210 above the implanted chalcogen dopant atoms 212 as shown in FIG. 8. After that, for example etching is carried out to form a trench 214 in the substrate 200 which is followed by in-diffusion (while a reverse order is also possible). The substrate 200 is annealed to drive in the chalcogen dopant atoms 212 to a desired depth as previously explained herein. The phosphorus-containing layer 210 can be used as an n+ channel stop region, or removed. Pt diffusion can also be carried for an adjustment of the dynamic behavior of the power device. Further processing can also be carried out, e.g. including removing the damage, implanting boron in the sidewalls 216, 218 and bottom 220 of the trench 214 e.g. in quart mode, followed by penetration, filling of the trench 218, planarization, metallization and passivation. The processing of the rear side is then performed to manufacture a field stop zone 222, cathode 224, and metallization 226 (for instance by an appropriate thin wafer technology).

Figure 9:
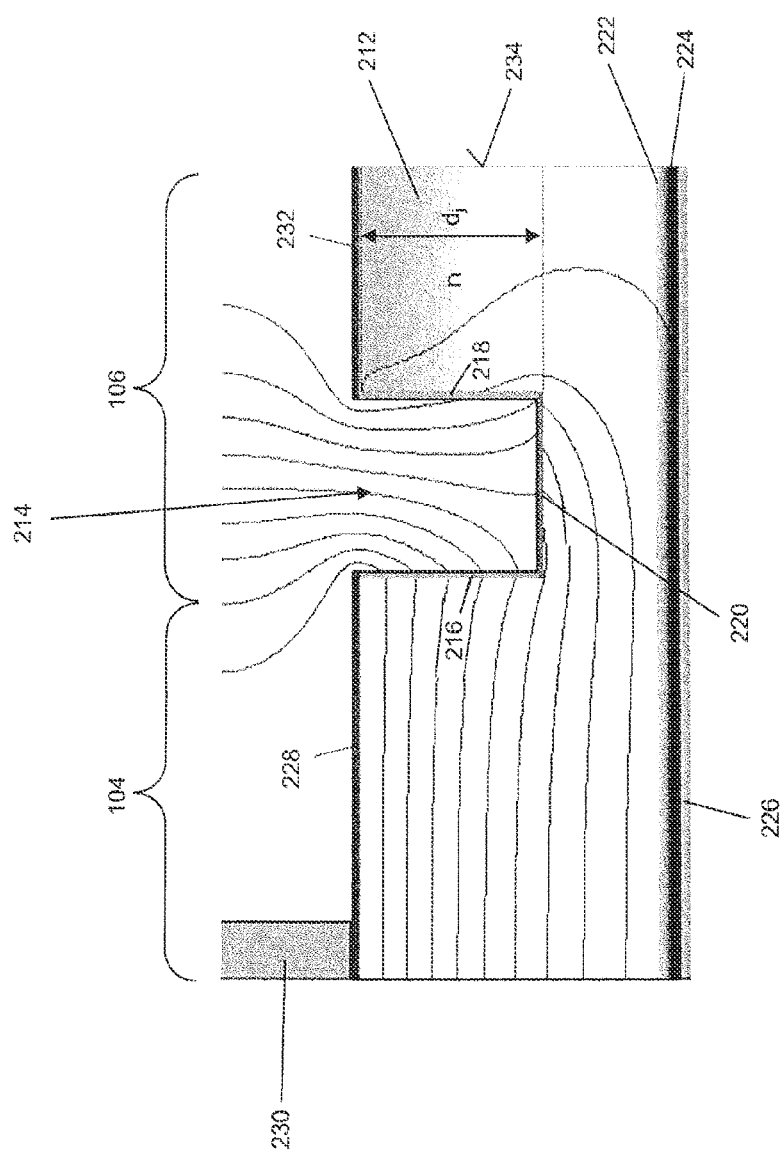
FIG. 9 illustrates a partial cross-sectional schematic view of a power semiconductor device according to an embodiment.

FIG. 9 shows an embodiment of a power diode e.g. manufactured in accordance with the above process. The diode is designed for application at 1,200 V. The semiconductor substrate 200 can be n-doped silicon with a specific resistance of 53 Ωcm and a chip thickness of 125 µm. On the top surface of the substrate is located a p+ doped anode 228 in the active device region 104 having a surface concentration of about $1 \cdot 10^{17}$ cm$^{-3}$ and a junction depth of about 6 µm, and a corresponding electrode 230. An optional n+ (or p+) doped channel stop region 232 is located adjacent the outer lateral edge 234 of the substrate 200 in the edge termination region 106.

On the rear side of the device is located the n+ emitter 224 which may have a surface concentration of about $3.5 \cdot 10^{15}$ cm$^{-3}$ and a penetration depth of about 2 µm. The field stop zone 222 may have a maximum concentration of about $1.3 \cdot 10^{14}$ cm$^{-3}$ and a penetration depth of 10 µm. The optional channel stop region 232 laterally extends between the outer sidewall 218 of the trench 214 and the lateral saw edge 234 of the substrate 200. The channel stop region 232 can have a surface concentration of $\geq 1 \cdot 10^{19}$ cm$^{-3}$ in order to provide a sufficient push effect for the inward diffusion of the chalcogen dopant atoms 212 such as selenium in this embodiment.

The vertical penetration depth of the channel stop region 232 into the substrate 200 can be in the range from 0.5 µm to about 5 µm, depending on the thermal budget.

The blocking voltage is absorbed at the edge 234 of the device by the trench 214 which can have a width of about 60 µm and a depth of about 70 µm. The sidewalls 216, 218 and the bottom 220 of the trench 214 can be provided with boron implantation using different doses e.g. p− doping for the inner sidewall 216, p doping for the bottom 220 and p− doping for the outer sidewall 218. The trench 214 can be filled with a material e.g. having a dielectric constant of $\epsilon=3.9$.

Phosphorus deposition or implantation of the n+ channel stop region 232 can be performed through the same mask, and Se (or other chalcogen) implantation can be performed in advance together with the inward diffusion of the channel stop region 232 (and of the anode region if desired). Se profiles can have a very high penetration depth with this type of processing as previously described herein. A relatively small thermal budget can also be realized in this case (e.g. with a total time period of 4.5 hours for P deposition and penetration at temperatures of 1,000° C.) with a diffusion Se depth of about 100 µm. The profile of Se distribution 212 in the numerical simulation was presumed in the vertical depth to have a Gaussian distribution without lateral concentration gradients. The region of Se (or other chalcogen) atoms 212 laterally extends, just like the channel stop region 232, from the outer trench sidewall 218 to the lateral edge 234 of the semiconductor substrate 200. The region of Se atoms 212 can have a penetration depth dj approximately the same as the trench bottom 220 as shown in FIG. 9, or can extend below the trench bottom 220 as shown in FIGS. 10 and 11 in the vertical direction.

FIG. 9 illustrates the distribution of the equipotential lines in the case when the edge concentration of the Se atoms 212 corresponds to about $1 \cdot 10^{15}$ cm$^{-3}$ and the Se penetration depth dj is about 70 µm. This corresponds to integration in the y direction and a surface dose of Se of about $3.9 \cdot 10^{12}$ cm$^{-2}$. As a result, a distinct pushing back of the outer potential lines is provided, in particular in the region of deep Se-indiffusion underneath the upper surface.

Figure 10:
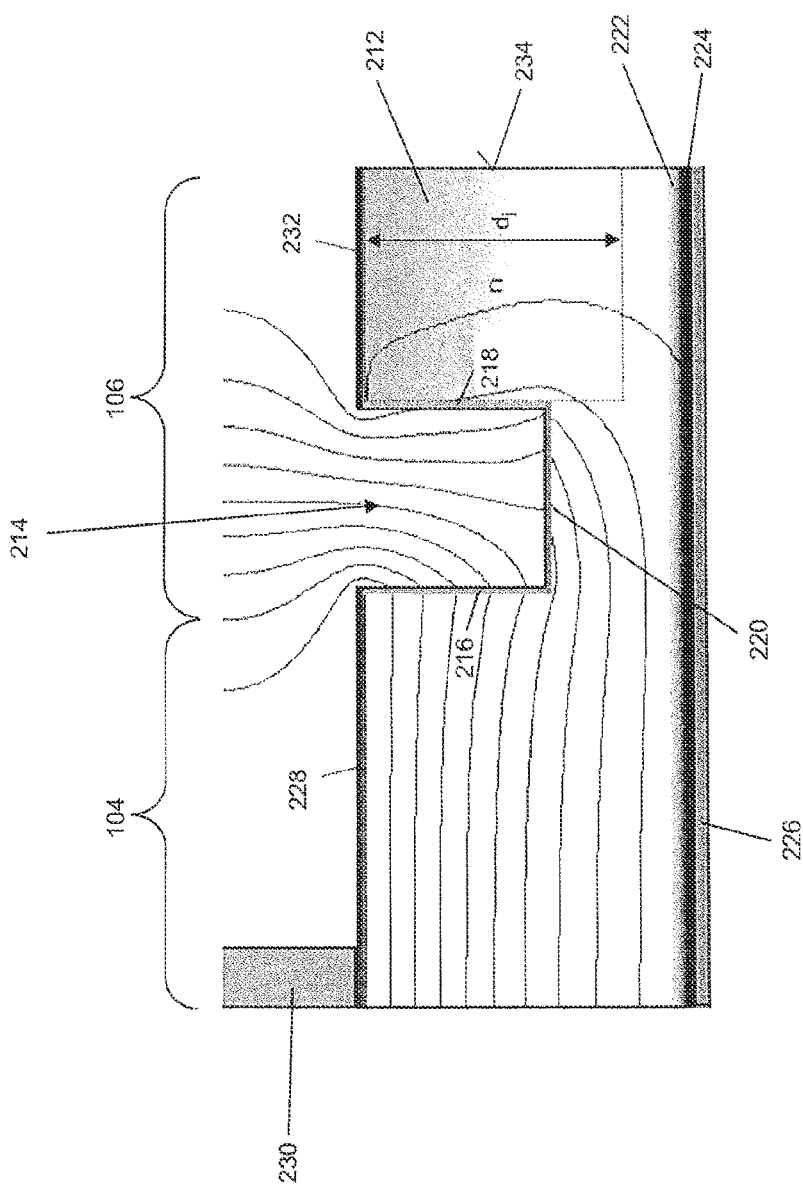
FIG. 10 illustrates a partial cross-sectional schematic view of a power semiconductor device according to an embodiment.

FIG. 10 illustrates another embodiment with a higher Se diffusion depth dj (e.g. 100 µm), but a smaller Se edge concentration (e.g. $3\sqrt{10^{14}}$ cm$^{-3}$). The Se dose value according to this embodiment is about $2.3 \cdot 10^{12}$ cm$^{-2}$ smaller than in the embodiment of FIG. 9. In spite of this difference, the result is even slightly better with respect to the lateral potential development. In both cases, the blocking capability of the device remains unchanged at 1,830 V.

Figure 11:
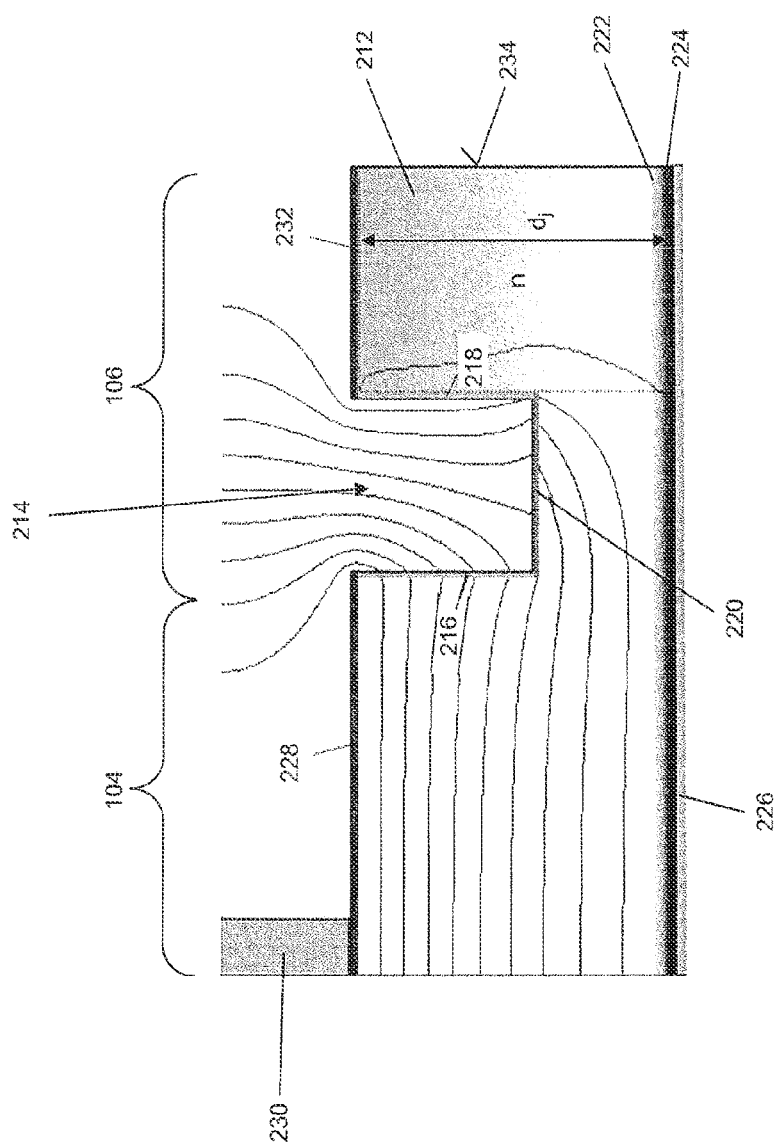
FIG. 11 illustrates a partial cross-sectional schematic view of a power semiconductor device according to an embodiment.

FIG. 11 illustrates yet another embodiment with an Se penetration depth dj on the order of magnitude of the substrate thickness. When the Se penetration depth is further increased to 150 µm (in which case the diffusion front already exceeds the final thickness of the substrate), and the Se edge concentration is again about $1 \cdot 10^{15}$ cm$^{-3}$, the resulting distribution of equipotential lines is as shown in FIG. 11. Under these boundary conditions, the edge termination size requirement can be further reduced, without exerting a detrimental influence on the blocking capability. The corresponding dose is about $8.4 \cdot 10^{12}$ cm$^{-2}$.

Figure 12:
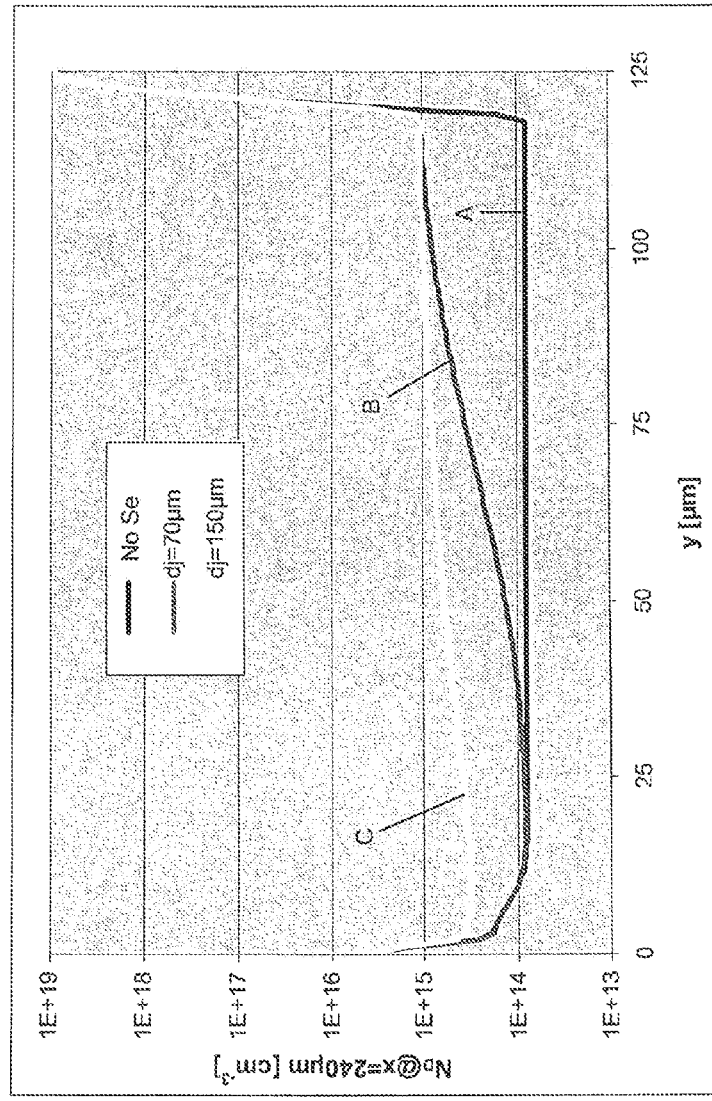
FIG. 12 is a plot diagram illustrating different doping profiles in the edge termination region of a power semiconductor device.

FIG. 12 illustrates the vertical doping distribution in the lateral field boundary zone for: a conventional device with an edge termination trench having p-doped sidewalls and bottom and an n+ channel stop region (curve A); the power semiconductor device shown in FIG. 9 (curve B); and the power semiconductor device shown in FIG. 11 (curve C). When the Se edge concentration is increased to $3 \cdot 10^{15}$ cm$^{-3}$ at a diffusion depth of 150 µm, an early avalanche breakdown can occur at the outer edge of the bottom of the trench. The blocking voltage drops in this case to 1,512 V (see FIG. 5). While a further contraction of the SCZ is only marginal realized, the loss with respect to the blocking voltage is significant. The embodiment of FIG. 11 thus represents an optimum (approximately) embodiment with regard to voltage blocking capability, depending of course on the particular device design and implementation.

The embodiments which provide a chalcogen dopant region in the edge termination region permit a reduction in the width of the lateral field region from the outer edge of the trench to the lateral side of the substrate 200 from about 70 μm to about 20 μm, thus providing a distinct shrinking of the size of the edge termination region 106, which could be of substantial significance for the termination of the trench edge. The dose values described above are in accordance with a simulation for between 2× and 6× of the breakdown charge for silicon with $1.4 \cdot 10^{12}$ cm$^{-2}$.

Figure 13:
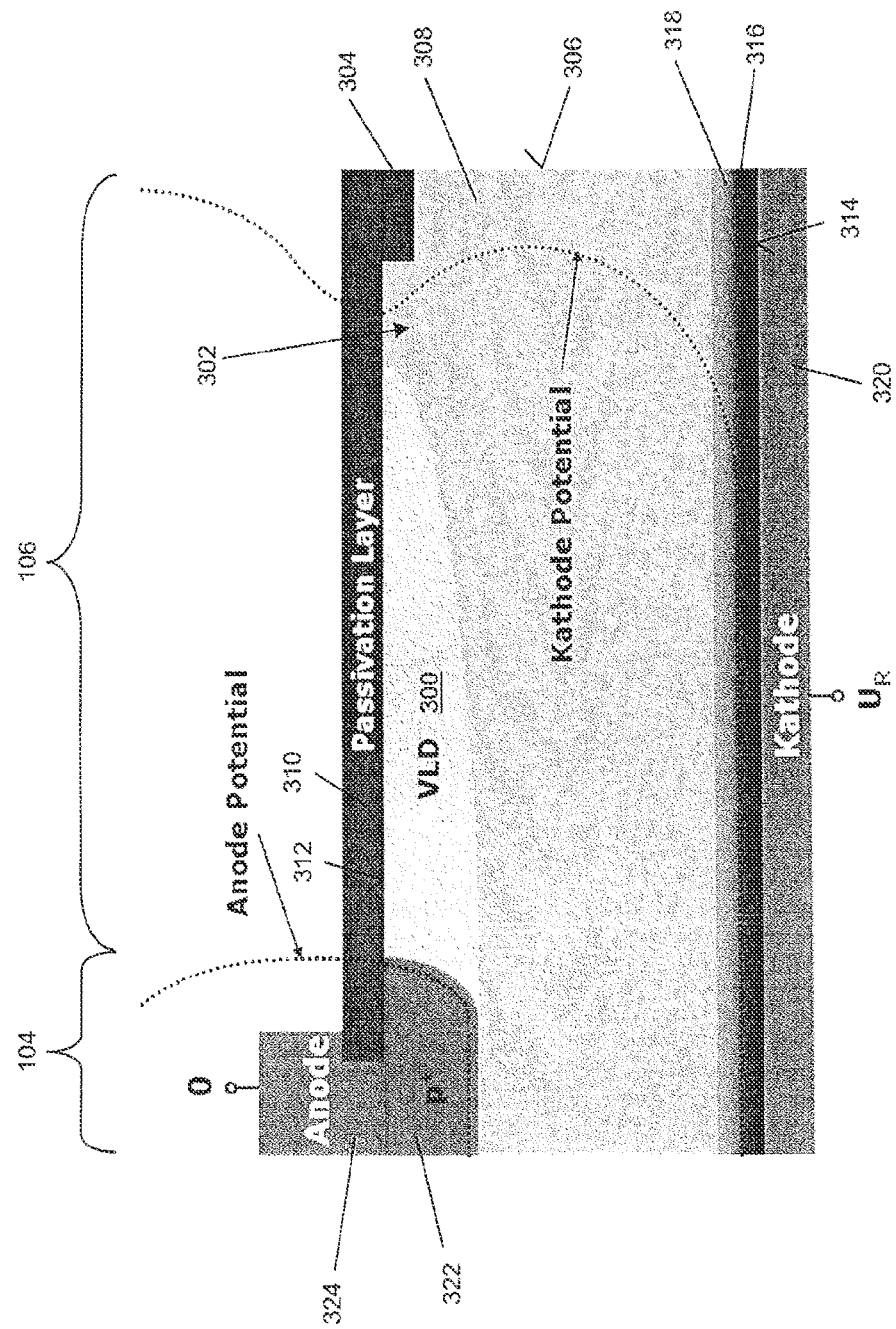
FIG. 13 illustrates a partial cross-sectional schematic view of a power semiconductor device according to an embodiment.

FIG. 13 illustrates yet another embodiment of the edge termination region 106, in which the field dissipation is performed in the lateral direction to the device edge with a so-called VLD (variation of lateral doping) edge termination structure 300. The VLD 300 extends laterally from the active device region 104 to a region of chalcogen dopant atoms 302 interposed between an n+ (or p+) channel stop region 304 and the VLD 300. Accordingly, the VLD 300 is spaced apart from the lateral edge 306 of the substrate 308 by the region of chalcogen dopant atoms 302 and the channel stop region 304. A passivation layer 310 is provided on the top surface 312 of the semiconductor substrate 308. Depending on the doping ratios and boundary surface conditions on the semiconductor surface for the passivation layer 310, a retrograde development of the equipotential lines can occur on the rear side 314 of the substrate 308 at which is located cathode 316. This retrograde development can be limited or completely eliminated by using a deep Se (or other chalcogen) diffusion as previously described herein. Also at the rear side 314 is a field stop zone 318 and metallization 320. At the top side 312 in the active device region 104 is the anode 322 and corresponding electrode 324.

Figure 14:
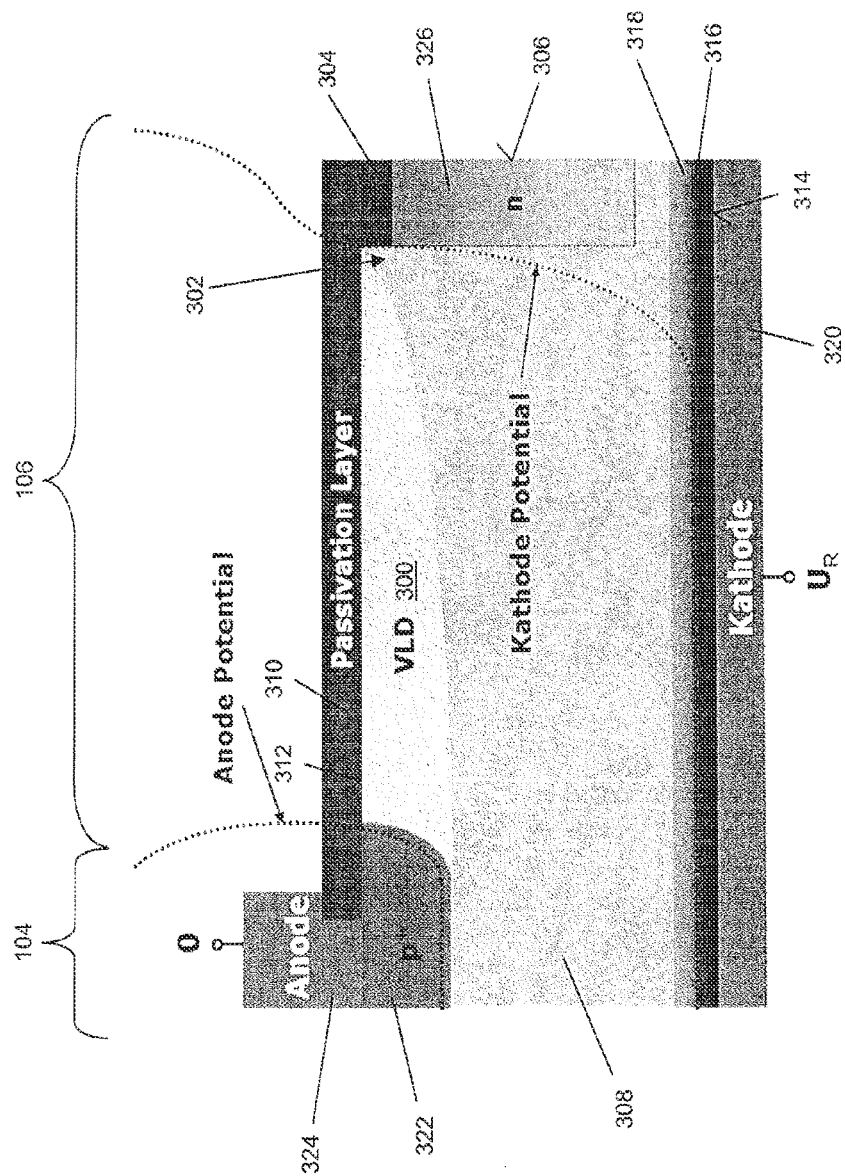
FIG. 14 illustrates a partial cross-sectional schematic view of a power semiconductor device according to an embodiment.

FIG. 14 illustrates yet another embodiment of the edge termination region 106 which is similar to the embodiment shown in FIG. 13, with introduction of a deep n-doped lateral field boundary zone 326 below the channel stop region 304. The deep lateral field boundary zone 326 permits a further reduction in the size of the edge termination region 106 by reducing the distance needed between the VLD region 300 and the channel stop region 304 for ensuring the voltage blocking capability of the device.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor device, comprising:
   a semiconductor substrate;
   an active device region disposed in the semiconductor substrate;
   an edge termination region spaced laterally outward from the active device region in the semiconductor substrate;
   a first trench disposed in the edge termination region and having an inner sidewall, an outer sidewall and a bottom, the inner sidewall spaced closer to the active device region than the outer sidewall; and
   a second trench spaced laterally outward from the first trench in the edge termination region, the second trench extending further into the semiconductor substrate than the first trench and having a sidewall which outwardly faces the outer sidewall of the first trench and is doped opposite as the inner sidewall and the bottom of the first trench.

2. The power semiconductor device of claim 1, wherein the second trench further comprises polysilicon adjacent the sidewall.

3. The power semiconductor device of claim 1, further comprising a channel stop region disposed at a first surface of the semiconductor substrate between the outer sidewall of the first trench and the sidewall of the second trench, the channel stop region having a same doping type as the sidewall of the second trench.

4. The power semiconductor device of claim 1, wherein the second trench is a closed trench in that the second trench is laterally contained on all sides by the semiconductor substrate.

5. The power semiconductor device of claim 1, wherein the second trench is an open trench in that the semiconductor substrate does not laterally contain the second trench in a region opposing the sidewall of the second trench.

* * * * *